United States Patent
Shih et al.

(10) Patent No.: US 10,431,492 B1
(45) Date of Patent: Oct. 1, 2019

(54) METHOD OF MANUFACTURING A SEMICONDUCTOR STRUCTURE

(71) Applicant: NANYA TECHNOLOGY CORPORATION, New Taipei (TW)

(72) Inventors: Shing-Yih Shih, New Taipei (TW); Hsin-Hung Ting, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/990,813

(22) Filed: May 28, 2018

(51) Int. Cl.
| | |
|---|---|
| *H01L 21/762* | (2006.01) |
| *H01L 21/033* | (2006.01) |
| *H01L 21/308* | (2006.01) |
| *H01L 21/8234* | (2006.01) |
| *H01L 21/8238* | (2006.01) |
| *H01L 21/32* | (2006.01) |

(52) U.S. Cl.
CPC .... *H01L 21/76224* (2013.01); *H01L 21/0332* (2013.01); *H01L 21/0334* (2013.01); *H01L 21/0337* (2013.01); *H01L 21/0338* (2013.01); *H01L 21/3081* (2013.01); *H01L 21/3083* (2013.01); *H01L 21/3086* (2013.01); *H01L 21/32* (2013.01); *H01L 21/823481* (2013.01); *H01L 21/823878* (2013.01)

(58) Field of Classification Search
CPC ....... H01L 21/76224; H01L 21/823481; H01L 21/823878; H01L 21/32; H01L 21/0332; H01L 21/0334; H01L 21/0337; H01L 21/0338; H01L 21/3081; H01L 21/3083
See application file for complete search history.

(56) References Cited

U.S. PATENT DOCUMENTS

| | | | | |
|---|---|---|---|---|
| 9,847,245 | B1* | 12/2017 | Kittl | H01L 21/30604 |
| 2003/0194870 | A1* | 10/2003 | Hsu | H01L 21/02238 |
| | | | | 438/694 |
| 2004/0266106 | A1* | 12/2004 | Lee | H01L 27/11517 |
| | | | | 438/257 |
| 2015/0014807 | A1* | 1/2015 | Chuang | H01L 21/76224 |
| | | | | 257/506 |
| 2015/0147882 | A1* | 5/2015 | Yao | H01L 21/76879 |
| | | | | 438/675 |
| 2018/0166324 | A1* | 6/2018 | Schaeffer | H01L 29/7812 |
| 2018/0190538 | A1* | 7/2018 | Chu | H01L 21/76229 |
| 2019/0074187 | A1* | 3/2019 | Shih | H01L 21/3088 |
| 2019/0074353 | A1* | 3/2019 | Zhao | H01L 21/0337 |
| 2019/0088486 | A1* | 3/2019 | Liu | H01L 21/28273 |
| 2019/0103477 | A1* | 4/2019 | Ko | H01L 29/66795 |

FOREIGN PATENT DOCUMENTS

TW             201503263 A             1/2015

* cited by examiner

*Primary Examiner* — Joseph C. Nicely
(74) *Attorney, Agent, or Firm* — CKC & Partners Co., LLC

(57) ABSTRACT

A method of manufacturing a semiconductor structure includes forming a lower hard mask layer on a substrate. A patterned middle hard mask layer is formed on the lower hard mask layer, and the patterned middle hard mask layer has a plurality of openings exposing a portion of the lower hard mask layer. A patterned lower hard mask layer and a textured substrate having a plurality of trenches are formed by etching the exposed portion of the lower hard mask layer and a portion of the substrate under the exposed portion of the lower hard mask layer. A steam treatment is then performed on the textured substrate having the trenchess. An isolation oxide layer is formed to fill the trenches.

12 Claims, 13 Drawing Sheets

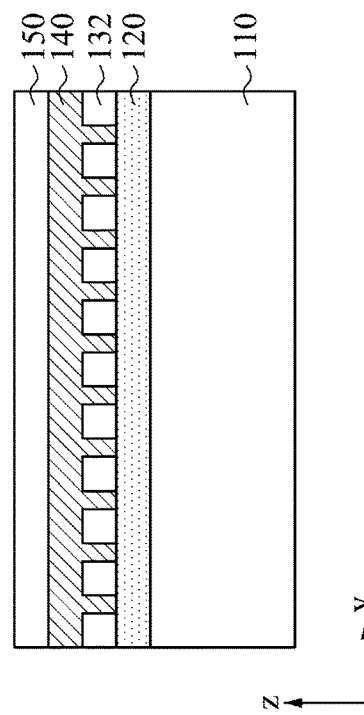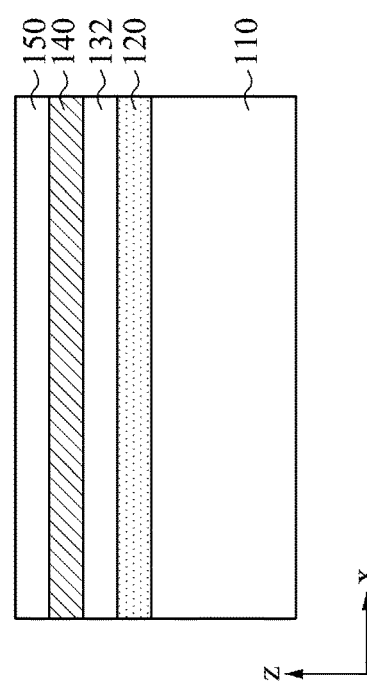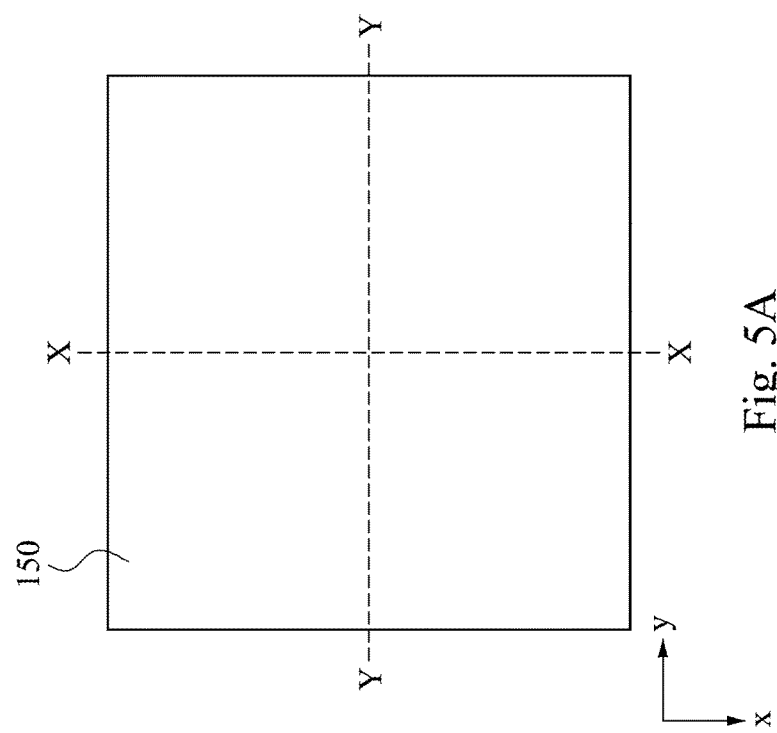

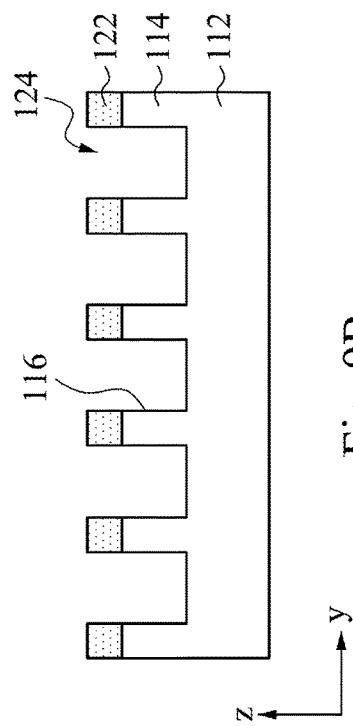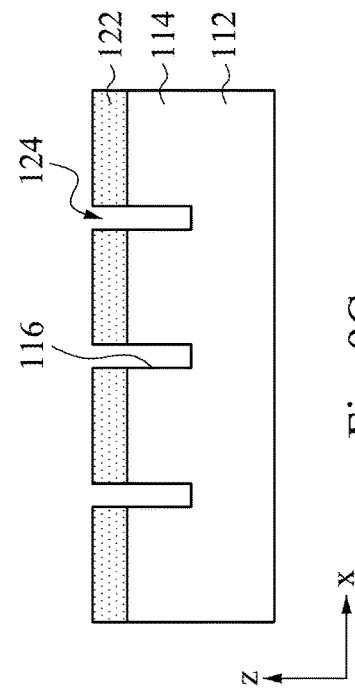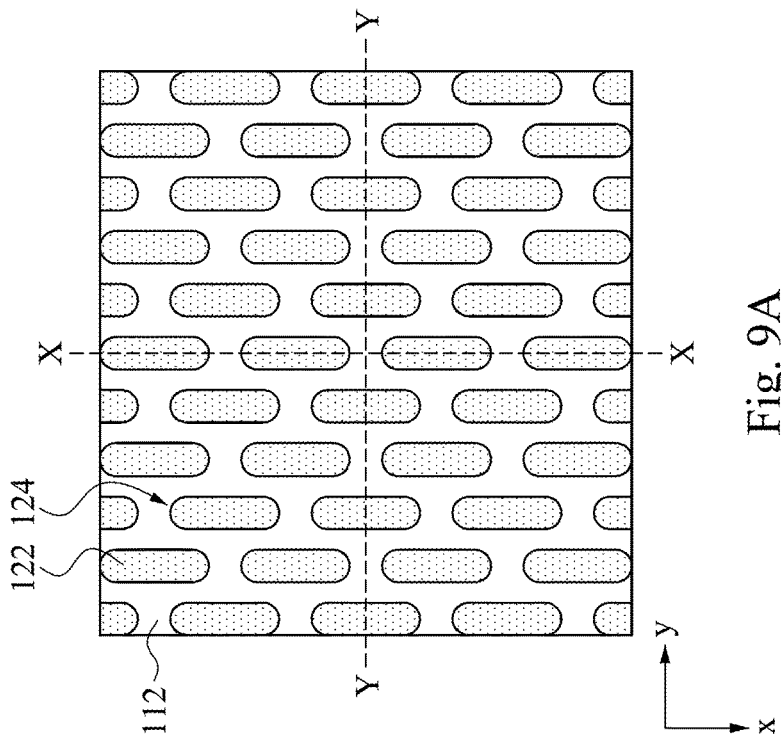

METHOD OF MANUFACTURING A SEMICONDUCTOR STRUCTURE

BACKGROUND

Field of Invention

The present invention relates to a method of manufacturing a semiconductor structure. More particularly, the present invention relates to a method for manufacturing fine trench isolation for semiconductor device.

Description of Related Art

In the semiconductor devices, an isolation structure is formed between the active areas for electrically insulated the active areas. As semiconductor devices become smaller and highly integrated, the required pitch size and critical dimension (CD) continue to shrink. According, the size of the isolation structure continues to shrink as well.

In the process of formation of the isolation structures, the fin-liked active areas easily collapse after dry etching and wet cleaning processes. In order to solve this problem, the wet cleaning process is substituted by a dry cleaning process. However, after filling a flowable oxide between the adjacent fin-liked active areas as an isolation structure, the fin-liked active areas still collapse. Therefore, there is a demand for a new approach to solve the problems mentioned above.

SUMMARY

The invention provides a method of manufacturing a semiconductor structure which has fine trench isolation.

In accordance with an aspect of the present invention, a method of manufacturing a semiconductor structure is provided. The method includes forming a lower hard mask layer on the substrate, forming a patterned middle hard mask layer on the lower hard mask layer, wherein the patterned middle hard mask layer has a plurality of openings exposing a portion of the lower hard mask layer, etching the exposed portion of the lower hard mask layer and a portion of the substrate under the exposed portion of the lower hard mask layer to form a patterned lower hard mask layer and a plurality of trenches in the substrate performing a steam process to the substrate, performing a steam treatment on the textured substrate having the trenches, and forming an isolation oxide layer to fill the trenches.

According to some embodiments of the present invention, the lower hard mask layer and the patterned middle hard mask layer are made of different material.

According to some embodiments of the present invention, the textured substrate has a plurality of inner surfaces, and each of the inner surfaces has a hydroxyl terminated group after performing the steam process.

According to some embodiments of the present invention, the patterned middle hard mask layer has a staggered arrangement pattern.

According to some embodiments of the present invention, forming the patterned middle hard mask layer on the lower hard mask layer includes a double patterning process.

According to some embodiments of the present invention, forming the patterned middle hard mask layer on the lower hard mask layer includes forming a layer of middle hard-mask material on the lower hard mask layer, patterning the layer of middle hard-mask material to form a line-patterned middle hard mask layer, wherein the line-patterned middle hard mask layer having a plurality of gaps exposing the lower hard mask layer, forming an upper hard mask layer covering the lower hard mask layer and the line-patterned middle hard mask layer, forming a patterned photoresist layer on the upper hard mask layer, wherein the patterned photoresist layer has a plurality of holes exposing a portion of the upper hard mask layer, etching the exposed portion of the upper hard mask layer and a portion of the line-patterned middle hard mask layer until the lower hard mask layer is exposed, and striping the upper hard mask layer.

According to some embodiments of the present invention, further comprising a BARC layer under the patterned photoresist layer.

According to some embodiments of the present invention, performing the steam process comprises treating the textured substrate with water vapor at 60-200° C. for a time period of 10-60 minutes.

According to some embodiments of the present invention, the isolation oxidelayer comprises Polysilazane based spin-on dielectric.

According to some embodiments of the present invention, the method further comprises performing a dry cleaning process to the substrate before performing the steam process.

According to some embodiments of the present invention, the dry cleaning process comprises using a gas having a chemical formula of $C_nF_xH_y$, wherein n is an integer of 1 or 2, x is an integer ranged between 1 and 6, y is an integer ranged between 0 and 3.

According to some embodiments of the present invention, forming the isolation oxide layer comprises densifying a flowable dielectric material.

According to some embodiments of the present invention, densifying the flowable dielectric material comprises UV curing process or thermal curing processs.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2A is a top view, FIG. 2B is a cross-sectional view along the y direction, and FIG. 2C is a cross-sectional view along the x direction.

FIG. 3A is a top view, FIG. 3B is a cross-sectional view along the y direction, and FIG. 3C is a cross-sectional view along the x direction.

FIG. 4A is a top view, FIG. 4B is a cross-sectional view along the y direction, and FIG. 4C is a cross-sectional view along the x direction.

FIGS. 5A to 5C show one of the various stages of manufacturing a semiconductor structure in accordance with some embodiments of this invention. FIG. 5A is a top view, FIG. 5B is a cross-sectional view along the y direction, and FIG. 5C is a cross-sectional view along the x direction.

FIG. 6A is a top view, FIG. 6B is a cross-sectional view along the y direction, and FIG. 6C is a cross-sectional view along the x direction.

FIG. 7A is a top view, FIG. 7B is a cross-sectional view along the y direction, and FIG. 7C is a cross-sectional view along the x direction.

FIG. 8A is a top view, FIG. 8B is a cross-sectional view along the y direction, and FIG. 8C is a cross-sectional view along the x direction.

FIGS. 9A to 9C show one of the various stages of manufacturing a semiconductor structure in accordance with some embodiments of this invention. FIG. 9A is a top view, FIG. 9B is a cross-sectional view along the y direction, and FIG. 9C is a cross-sectional view along the x direction.

FIG. 10A is a top view, FIG. 10B is a cross-sectional view along the y direction, and FIG. 10C is a cross-sectional view along the x direction.

FIG. 11A is a top view, FIG. 11B is a cross-sectional view along the y direction, and FIG. 11C is a cross-sectional view along the x direction.

FIG. 12A is a top view, FIG. 12B is a cross-sectional view along the y direction, and FIG. 12C is a cross-sectional view along the x direction.

FIG. 13A is a top view, FIG. 13B is a cross-sectional view along the y direction, and FIG. 13C is a cross-sectional view along the x direction.

DETAILED DESCRIPTION

Figure 1:
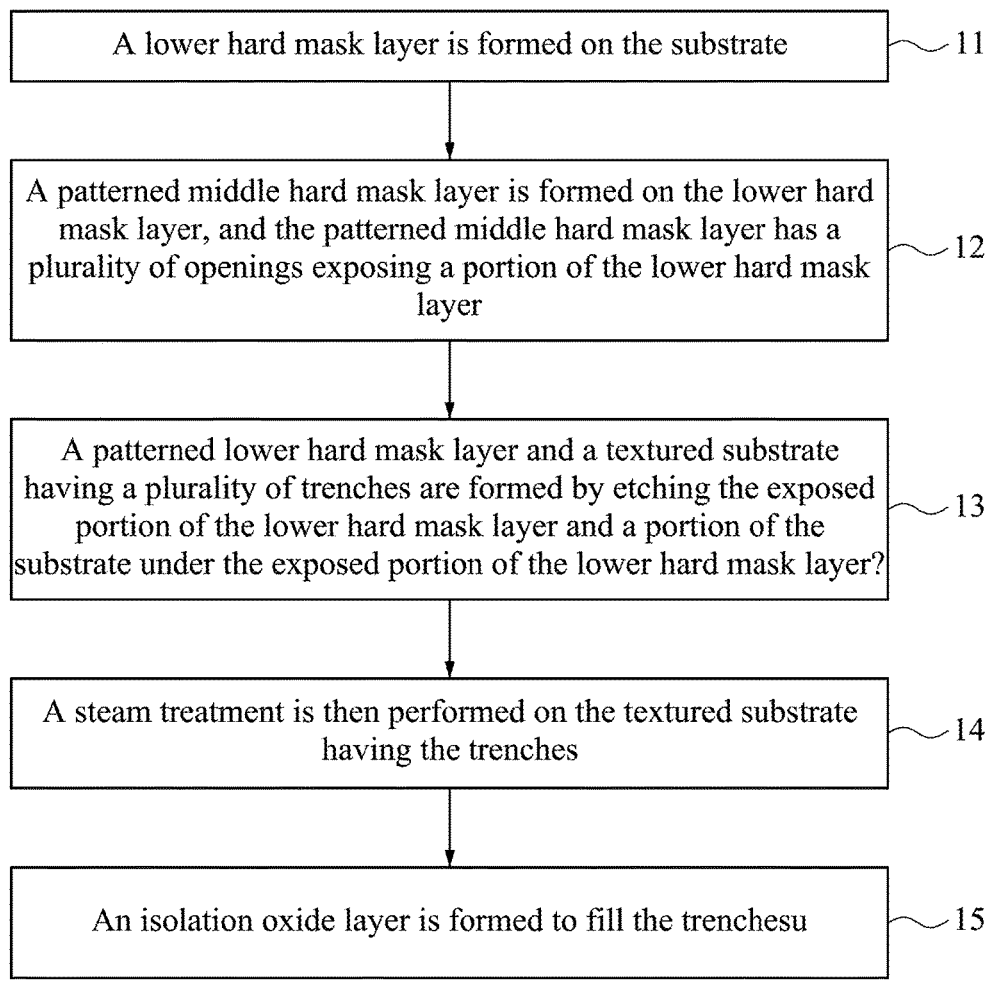
FIG. 1 is a flow chart illustrating a method of manufacturing a semiconductor structure in accordance with some embodiments of this invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a flow chart of a method 10 of manufacturing a semiconductor structure in accordance with some exemplary embodiments of the present invention. The method 10 begins with operation 11 in which a lower hard mask layer is formed on the substrate. The method continues with operation 12 in which a patterned middle hard mask layer is formed on the lower hard mask layer, and the patterned middle hard mask layer has a plurality of openings exposing a portion of the lower hard mask layer. The method continues with operation 13 in which a patterned lower hard mask layer and a textured substrate having a plurality of trenches are formed by etching the exposed portion of the lower hard mask layer and a portion of the substrate under the exposed portion of the lower hard mask layer. The method continues with operation 14 in which a steam treatment is then performed on the textured substrate having the trenches. The method continues with operation 15 in which a dielectric layer is formed to fill the trenches. The discussion that follows illustrates embodiments of semiconductor structure that can be manufactured according to the method 10 of FIG. 1. While method 10 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 2A to FIG. 13C are respectively top and cross-sectional views schematically illustrating various stages in manufacturing of a semiconductor structure in accordance with various embodiments. In FIGS. 2A to 12C, figures ending with an "A" designation are illustrated a top view of the semiconductor structure, figures with a "B" designation are illustrated along the cross-section Y-Y', figures with a "C" designation are illustrated along the cross-section X-X'.

Figure 2B:
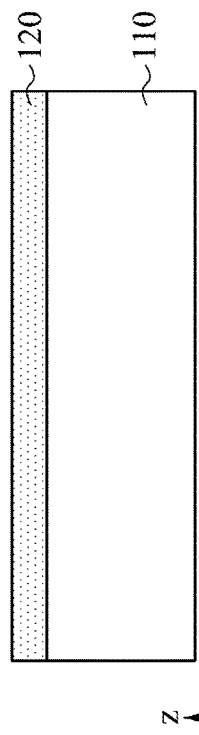
FIGS. 2A to 2C show one of the various stages of manufacturing a semiconductor structure in accordance with some embodiments of this invention.
Figure 2C:
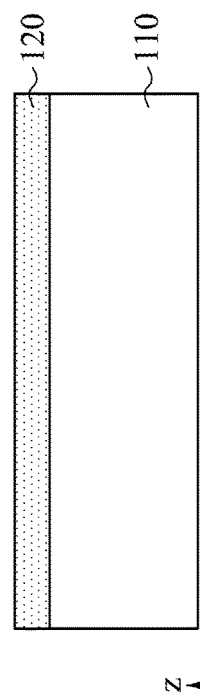
Figure 2A:
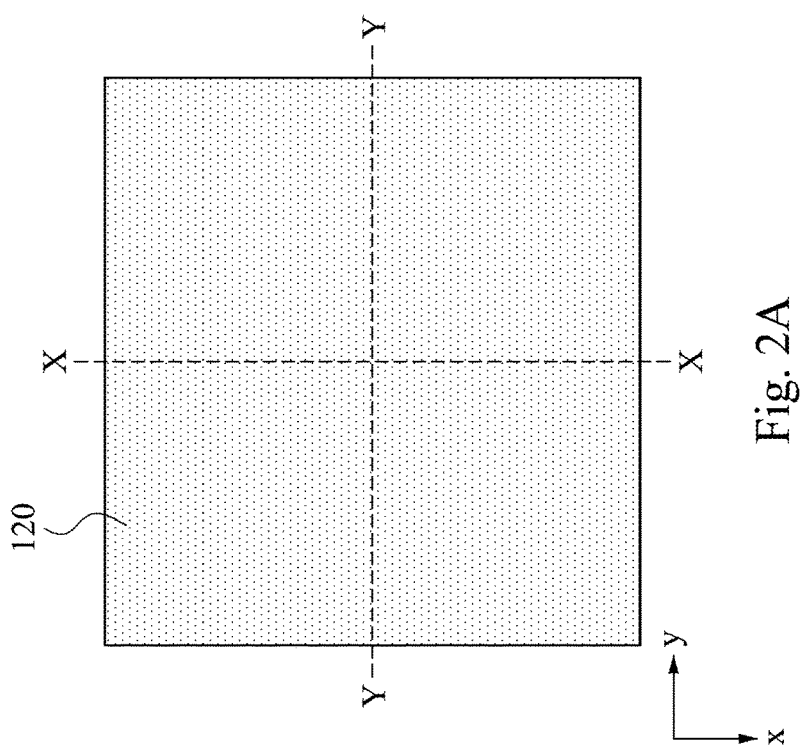

Reference is made to FIGS. 2A to 2C. A lower hard mask layer 120 is formed on the substrate 110 (operation 11 of FIG. 1). Formation of the lower hard mask layer 120 may include any suitable deposition method, such as plasma-enhanced atomic layer deposition (PEALD), chemical vapor deposition (CVD), plasma-enhanced chemical vapor deposition (PECVD), physical vapor deposition (PVD), and the like. In some embodiments, the substrate 110 may be any suitable substrate that includes silicon (Si). In some embodiments, the lower hard mask layer 120 may include SiN, SiO, SiON, silicon carbide, or the like.

FIGS. 3A to 8C are figures illustrating detailed steps to implement operation 12 of FIG. 1, in which a patterned middle hard mask layer 136 (shown in FIGS. 8A-8C) is formed on the lower hard mask layer 120. Formation of the patterned middle hard mask layer 136 on the lower hard mask layer 120 may comprise a double patterning process, which is described hereinafter.

Figure 3B:
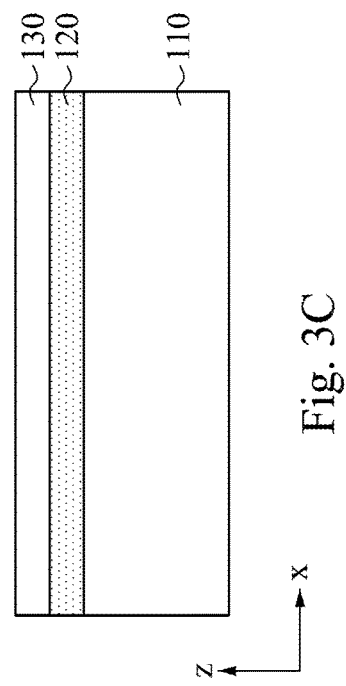
FIGS. 3A to 3C show one of the various stages of manufacturing a semiconductor structure in accordance with some embodiments of this invention.
Figure 3C:
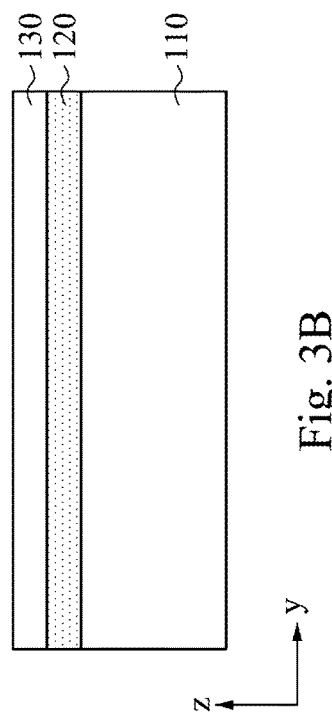
Figure 3A:
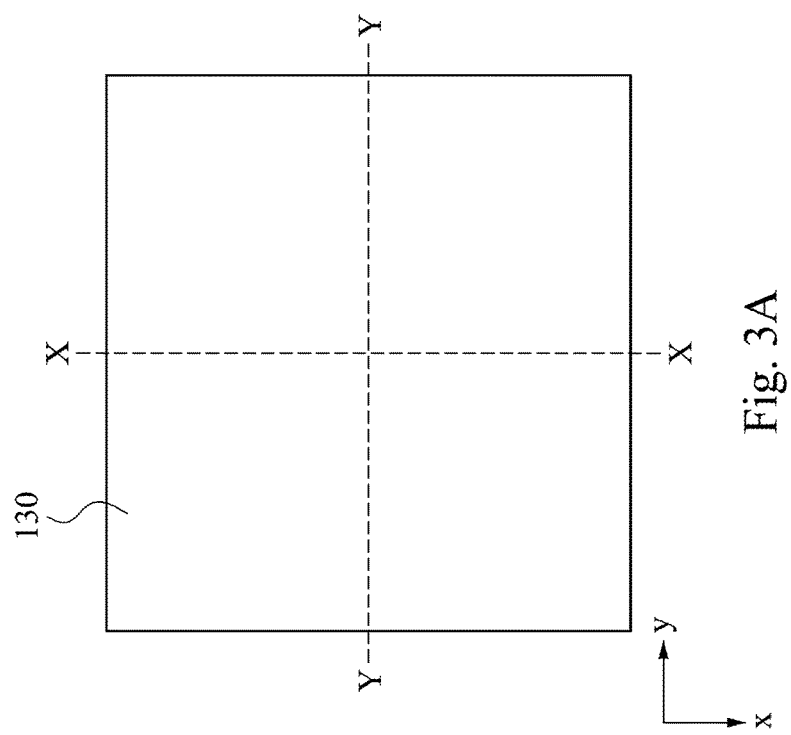

Referring to FIGS. 3A to 3C, a layer 130 of middle hard-mask material is formed on the substrate 110. In some embodiments, the layer 130 of middle hard-mask material may include SiN, SiO, SiON, silicon carbide, or the like. In some embodiments, the lower hard mask layer 120 and the layer 130 of middle hard-mask material are made of different material, that is, the lower hard mask layer 120 may have an etch selectivity different from the layer 130 of middle hard-mask material.

Figure 4C:
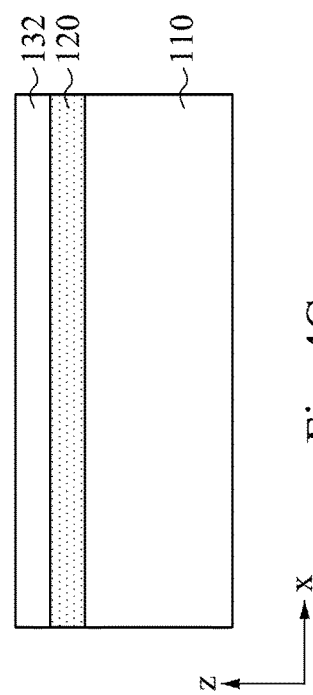
FIGS. 4A to 4C show one of the various stages of manufacturing a semiconductor structure in accordance with some embodiments of this invention.
Figure 4B:
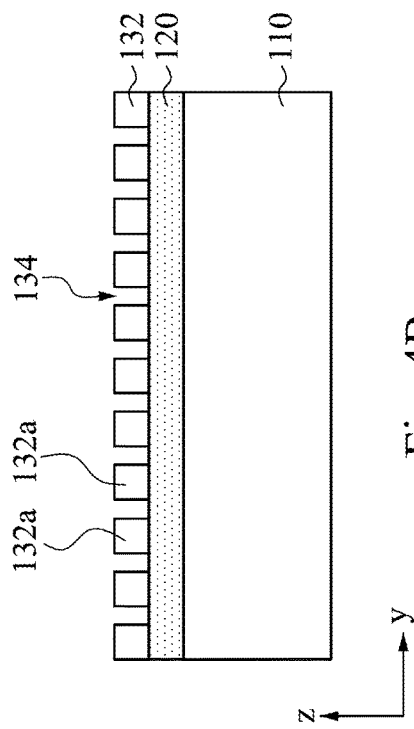
Figure 4A:
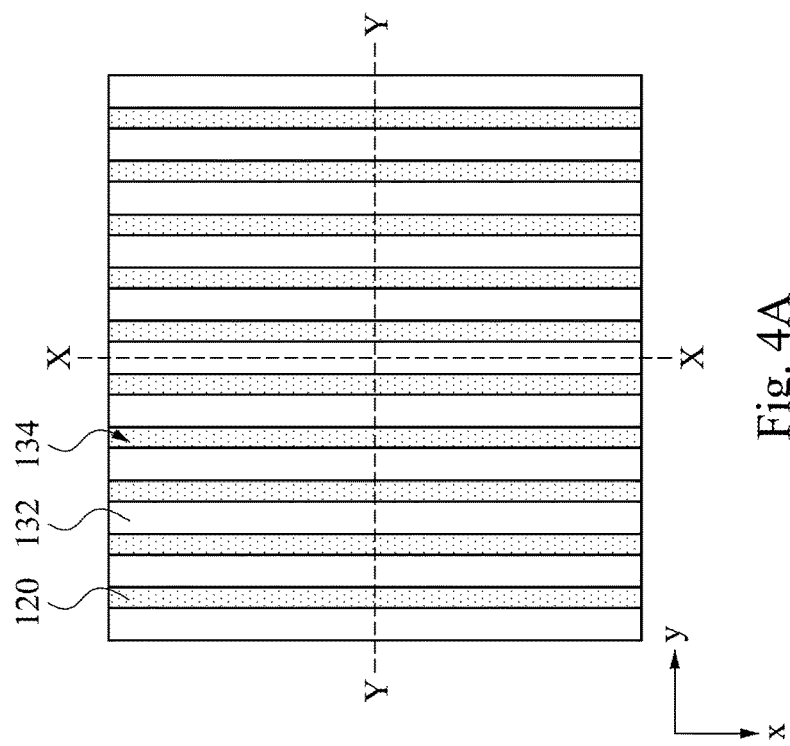

Referring to FIGS. 4A to 4C, the layer 130 of middle hard-mask material is patterned to form a line-patterned middle hard mask layer 132. As shown in FIG. 4B, the line-patterned middle hard mask layer 132 has a plurality of gaps 134 exposing the lower hard mask layer 120. In some examples, the line-patterned middle hard mask layer 132 includes a plurality of stripes 132a that are parallel with each other.

Referring now to FIGS. 5A to 5C, an upper hard mask layer 140 and a photoresist layer 150 are formed on the substrate 110. The upper hard mask layer 140 fills the gaps 134 and covers the lower hard mask layer 120 and the line-patterned middle hard mask layer 132. Formation of the photoresist layer 150 may include, for example, spin-on coating a photoresist material on the upper hard mask layer 140. In some embodiments, the photoresist layer 150 may be a single layer or a multiple-layered structure. In some embodiments, a BARC layer may be formed under the photoresist layer 150. In some embodiments, the upper hard mask layer 140 may include SiN, SiO, SiON, silicon carbide, or the like. In some embodiments, the upper hard mask layer 140 may have an etch selectivity different from the line-patterned middle hard mask layer 132.

Figure 6B:
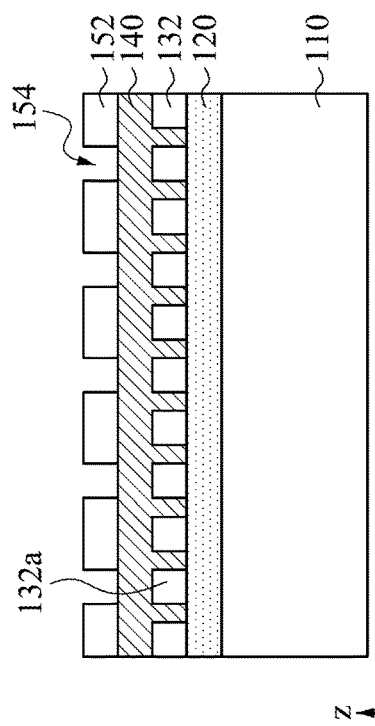
FIGS. 6A to 6C show one of the various stages of manufacturing a semiconductor structure in accordance with some embodiments of this invention.
Figure 6C:
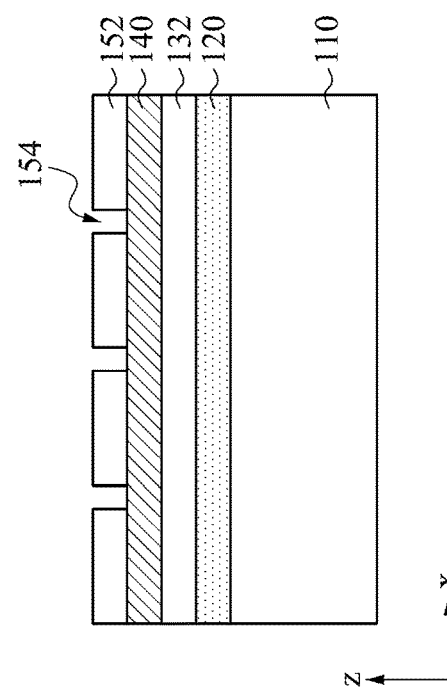
Figure 6A:
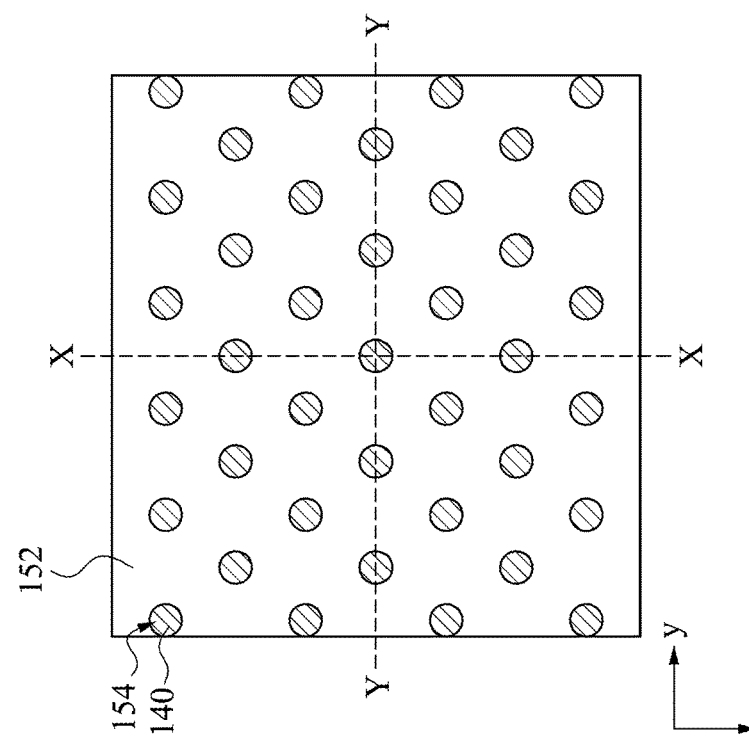

Referring to FIGS. 6A to 6C, a patterned photoresist layer 152 is formed on the upper hard mask layer 140, and the patterned photoresist layer 152 has a plurality of holes 154 exposing a portion of the upper hard mask layer 140. Formation of the patterned photoresist layer 152 may include coating a layer of photoresist material and then patterning the photoresist layer 150 (e.g., photolithographic process). In some embodiments, the holes 154 are arranged in the patterned photoresist layer 152 (FIG. 6A) along x direction and y direction in a staggered manner. As shown in FIG. 6B and 6C, each stripe 132a of the line-patterned middle hard mask layer 132 is overlapped with a plurality of holes 154 in z direction.

Figure 7B:
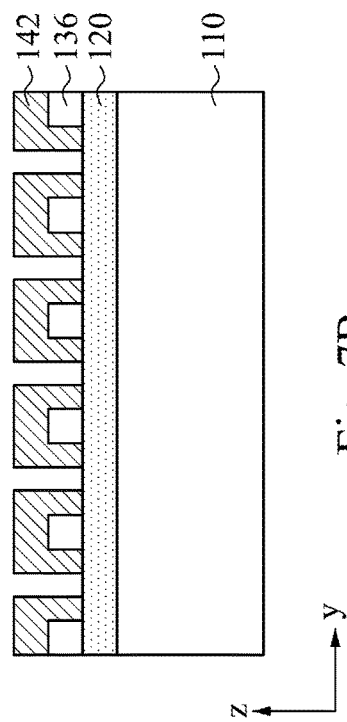
FIGS. 7A to 7C show one of the various stages of manufacturing a semiconductor structure in accordance with some embodiments of this invention.
Figure 7C:
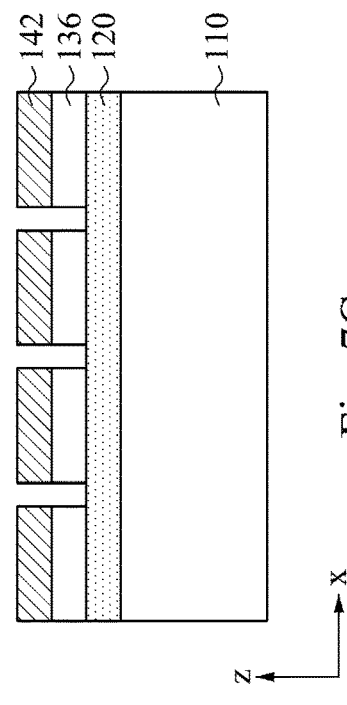
Figure 7A:
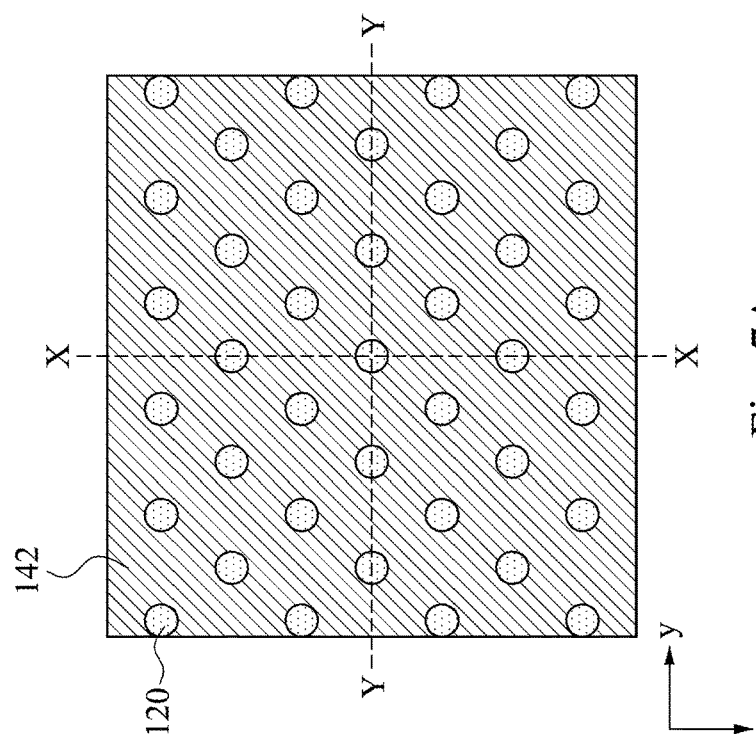

Reference is made to FIGS. 7A to 7C. The upper hard mask layer 140 is etched, using the patterned photoresist layer 152 as an etch barrier, to form a patterned upper hard mask layer 142. The etching continues to etch away portions of the stripes 132a which are under the holes 154 until the lower hard mask layer 120 is exposed. In other words, the line-patterned middle hard mask layer 132 is partially etched to form a patterned middle hard mask layer 136. In some examples, the diameter of each hole 154 is greater than the width of each stripe 132a so as to ensure that each stripe 132a is cut off at positions of the holes 154. The patterned photoresist layer 152 may be removed during or after the etching of upper hard mask layer 140 and the line-patterned middle hard mask layer 132.

Figure 8B:
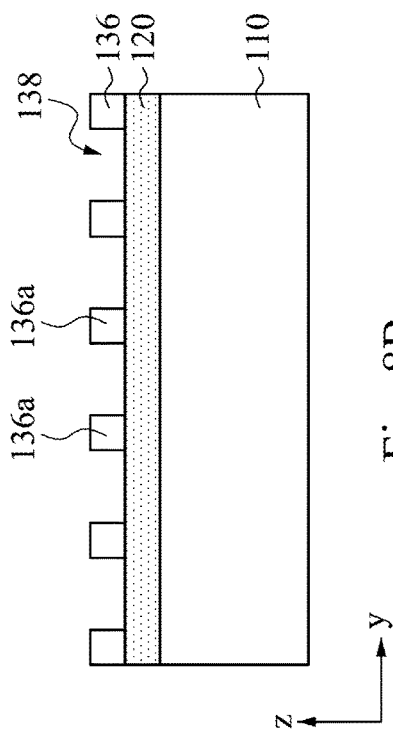
FIGS. 8A to 8C show one of the various stages of manufacturing a semiconductor structure in accordance with some embodiments of this invention.
Figure 8C:
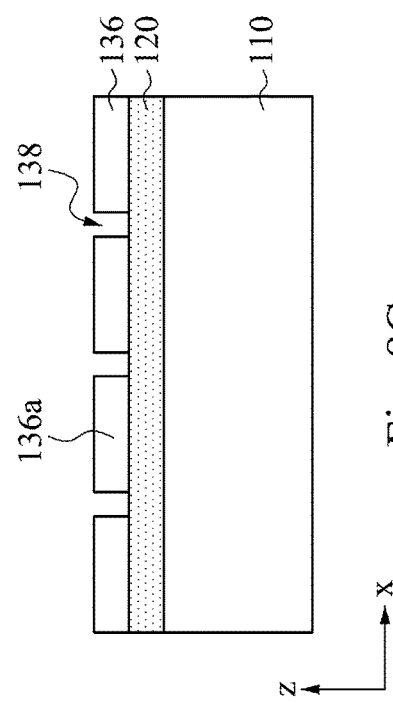
Figure 8A:
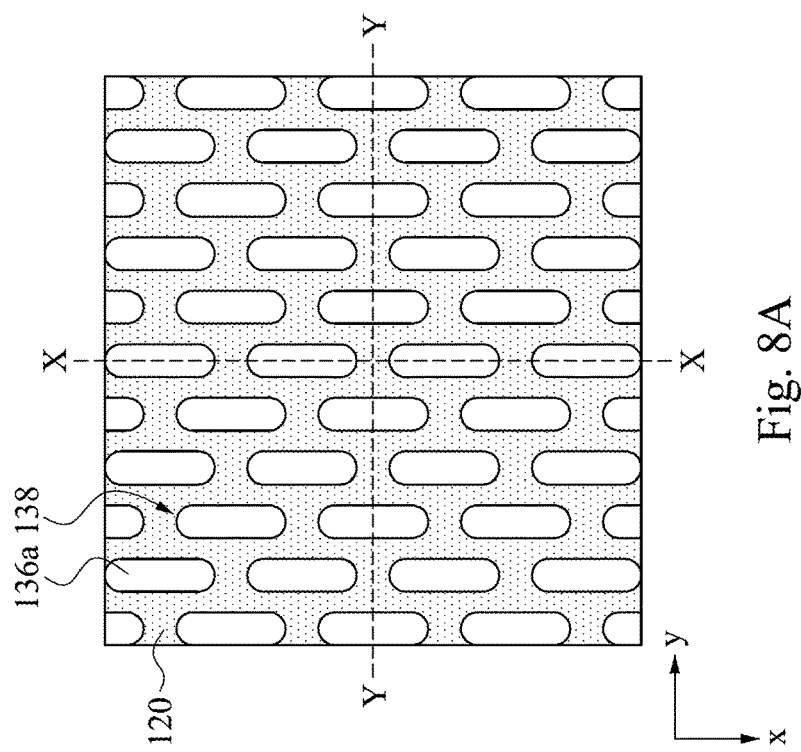

Referring to FIGS. 8A to 8C, the upper hard mask layer 142 is stripped or removed and the patterned middle hard mask layer 136 is exposed out. The patterned middle hard mask layer 136 has a plurality of openings 138 which are located approximately corresponding to the holes 154. In some embodiments, etching the stripes 132a (i.e., line-patterned middle hard mask layer 132) is performed by an over-etching operation, and therefore the patterned middle hard mask layer 136 has a number of island structures 136a each having round corners at two ends of the x direction, but this invention is not limited thereto. The island structures 136a of the patterned middle hard mask layer 136 are spaced apart from each other, and a portion of the lower hard mask layer 120 is exposed out through the space between the island structures 136a. In some embodiments, the patterned middle hard mask layer 136 has a staggered arrangement pattern (as shown in FIG. 8A).

Reference is made to FIGS. 9A to 9C. The exposed portion of the lower hard mask layer 120 and the underlying portion of the substrate 110 are etched, using the patterned middle hard mask layer 136 (i.e., island structures 136a) as mask, to form a patterned lower hard mask layer 122 and a textured substrate 112 having a plurality of trenches 124 (operation 13 of FIG. 1). As shown in FIGS. 9B and 9C, the textured substrate 112 includes a plurality of highland portions 114 each separating adjacent trenches 124. In addition, each trench 124 has an inner surface 116. In some embodiments, operation 13 includes a dry etching process such as a reactive ion etching (RIE) process. In some embodiments, the inner surface 116 may be a hydrophobic silicon surface.

Figure 10B:
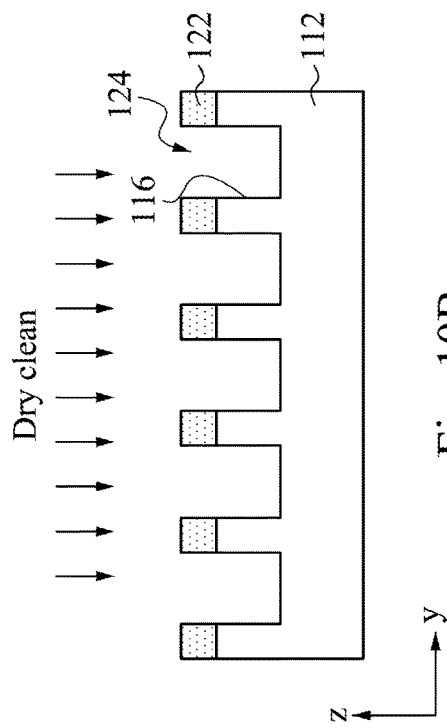
FIGS. 10A to 10C show one of the various stages of manufacturing a semiconductor structure in accordance with some embodiments of this invention.
Figure 10C:
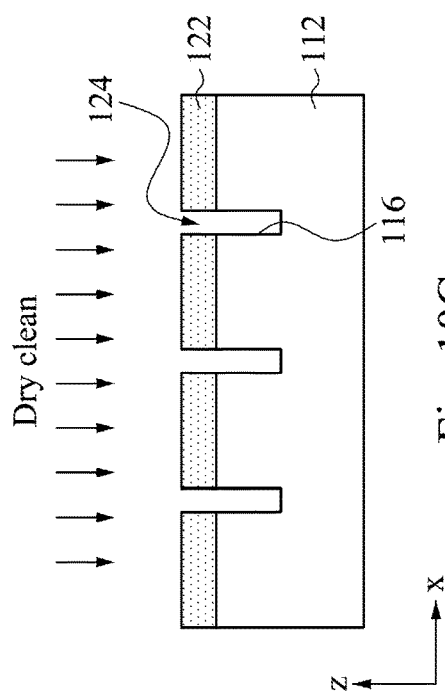
Figure 10A:
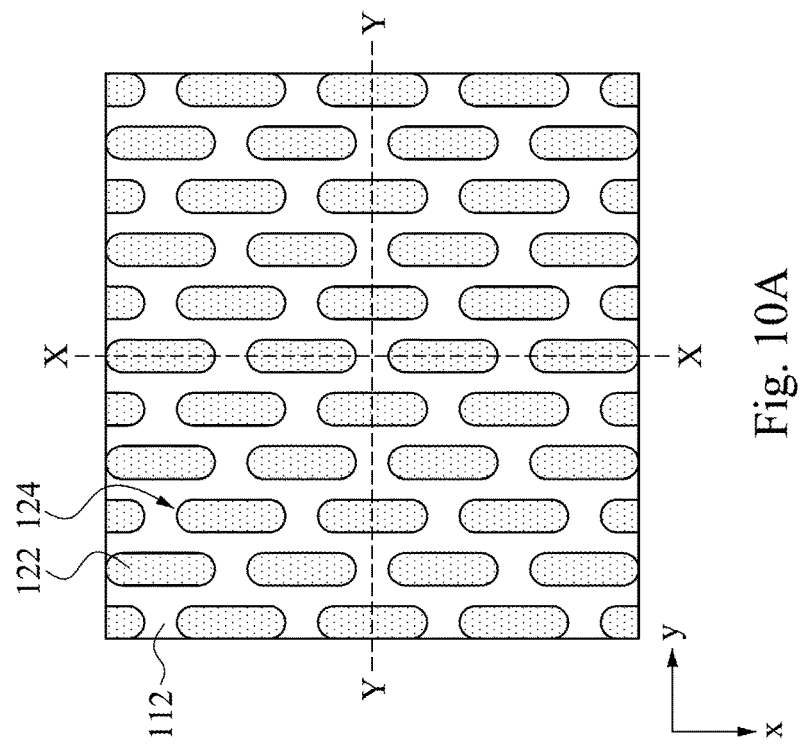

Referring to FIGS. 10A to 10C, after operation 13, a dry cleaning process may be optionally performed on the structure shown in FIGS. 9A to 9C. In some embodiments, the dry cleaning process includes using a fluorocarbon gas to remove a residue after the dry etching process. In some embodiments, the fluorocarbon gas has a chemical formula of $C_nF_xH_y$, wherein n is an integer of 1 or 2, x is an integer ranged between 1 and 6, y is an integer ranged between 0 and 3. In some embodiments, (x+y) is equal to 6. For example, the fluorocarbon gas may be $CF_4$, $C_2F_6$, $CHF_3$, and a combination of thereof.

Figure 11B:
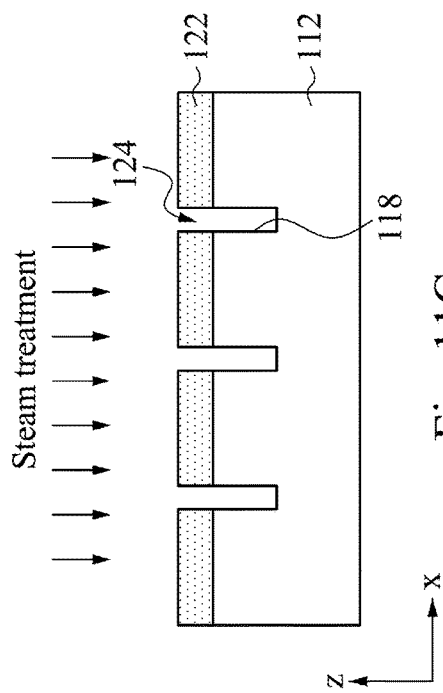
FIGS. 11A to 11C show one of the various stages of manufacturing a semiconductor structure in accordance with some embodiments of this invention.
Figure 11C:
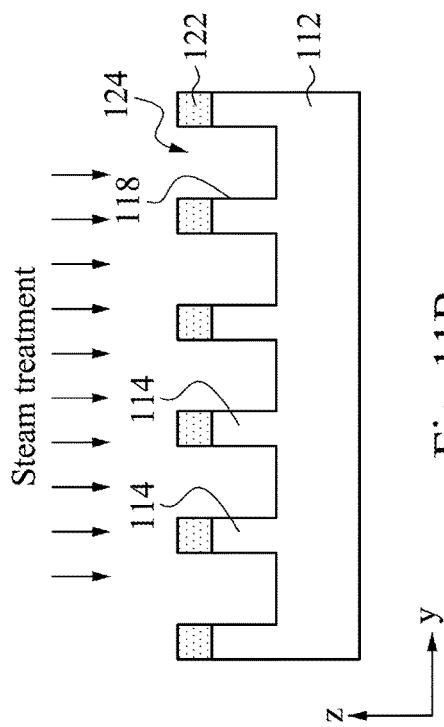
Figure 11A:
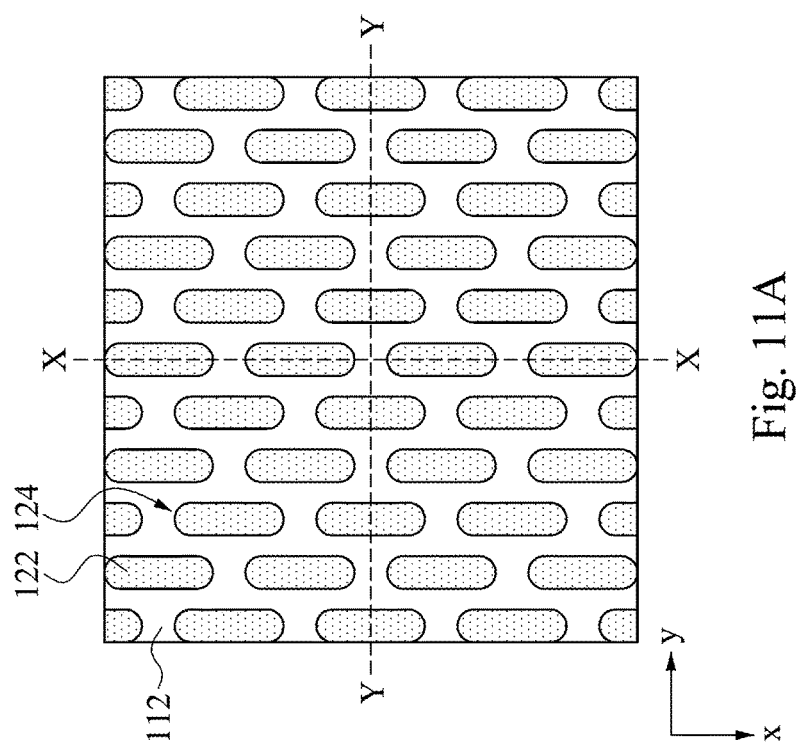

Reference is made to FIGS. 11A to 11C. The textured substrate 112 is treated with a steam (operation 14 of FIG. 1) after the dry cleaning process shown in or after operation 13. In some embodiments, performing the steam treatment includes treating the textured substrate 112 with water vapor at 60-200° C. for a time period of 10-60 minutes. In some embodiments, the steam treatment is performed under a normal pressure (i.e., approximately 1 atm). In examples, the inner surface 116 of the textured substrate 112 may be exposed to the water vapor under approximately 1 atm at 100° C. for 30 minutes. The textured substrate 112 is then placed on a hot plate to be dried. In some embodiments, after performing the steam treatment, the inner surface 116 of the textured substrate 112 may become a hydroxyl surface 118 that has hydroxyl terminated groups. The hydroxyl surface 118 of the textured substrate 112 may help to chemically bond the inner surfaces 116 with a flowable dielectric material formed in the subsequent operation.

Figure 12B:
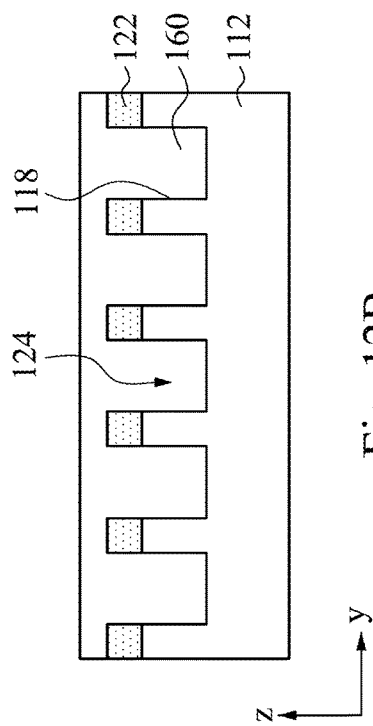
FIGS. 12A to 12C show one of the various stages of manufacturing a semiconductor structure in accordance with some embodiments of this invention.
Figure 12C:
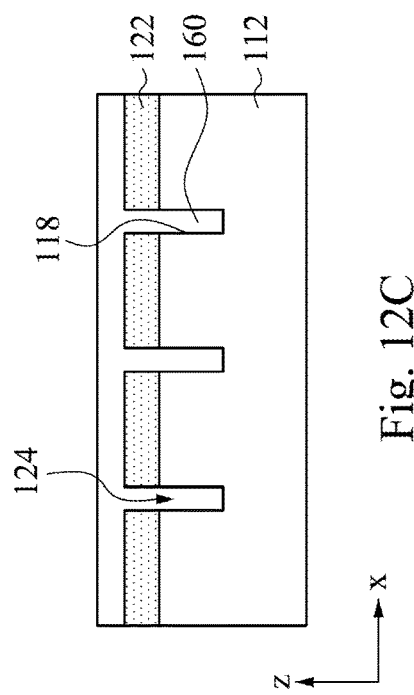
Figure 12A:
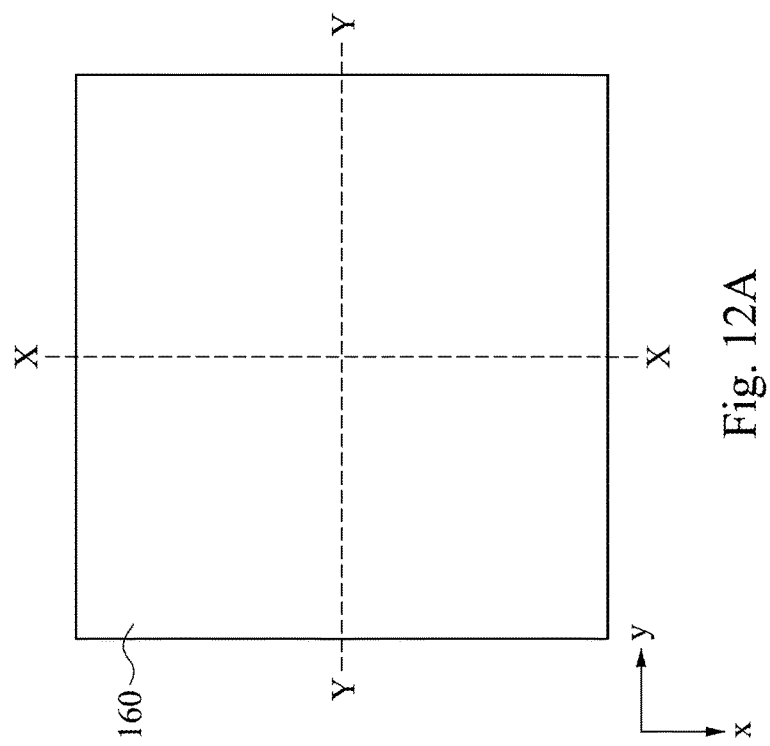

Reference is made to FIGS. 12A to 12C. An isolation oxide layer 160 is formed deposited filling the trenches 124 (operation 15 of FIG. 1). The isolation oxide layer 160 may be formed from a flowable dielectric material. In some embodiments, the flowable dielectric material includes polysilazane based spin-on dielectric, or the like. In yet some embodiments, the flowable dielectric material may have a repeated unit of —HN—SiH$_2$—NH—. In yet some embodiments, the flowable dielectric material may further be densified to form the isolation oxide layer 160. In some examples, densifying the flowable dielectric material may include performing a UV curing process or a thermal curing process. For example, the trenches 124 are filled with a flowable dielectric material, and the flowable dielectric material may be heated under an oxygen-containing or a water-containing atmosphere, thereby forming the isolation oxide layer 160. The flowable dielectric material may react with the hydroxyl terminated group of the hydroxyl surface 118 to form a chemical bond there between. Accordingly, the highland portions 114 of the textured substrate 112 are favorably stronger in structure, as compared with conventional techniques, and are not damaged or collapsed during the formation of the isolation oxide layer 160. Moreover, the highland portions 114 formed according to the embodiments can endure subsequent processes.

Figure 13B:
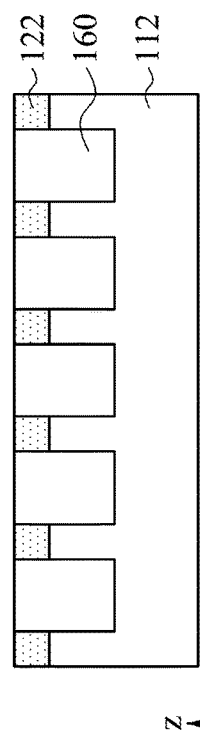
FIGS. 13A to 13C show one of the various stages of manufacturing a semiconductor structure in accordance with some embodiments of this invention.
Figure 13C:
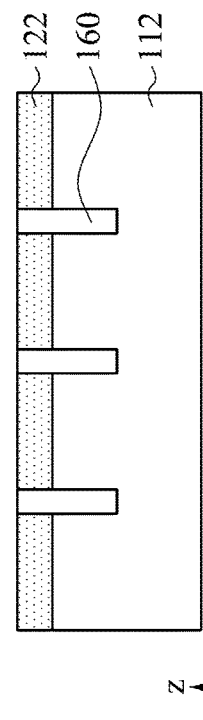
Figure 13A:
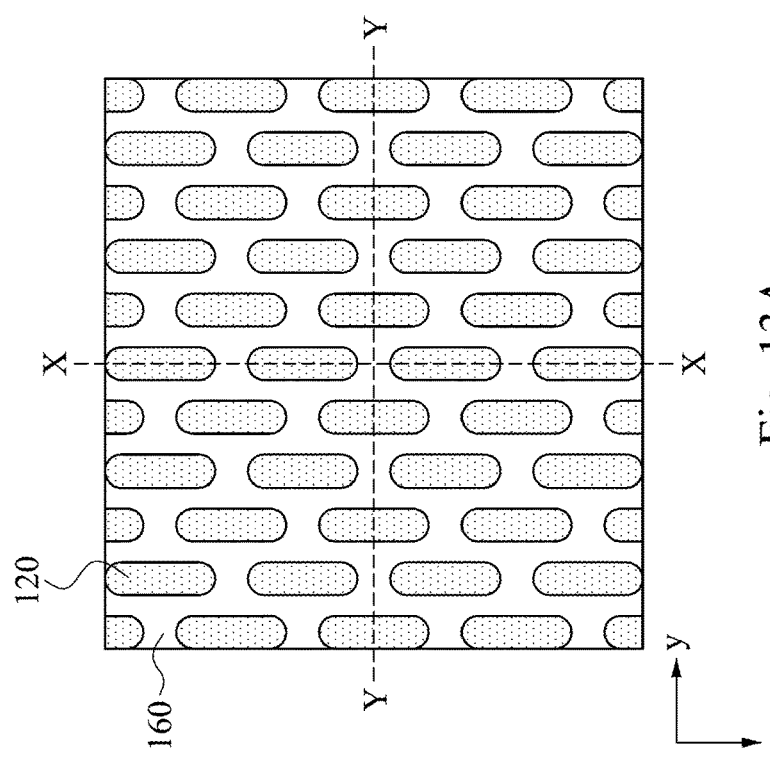

In some embodiments, as shown in FIGS. 13A to 13C, a planarization process may be performed to remove a top portion of the isolation oxide layer 160, thereby exposing the patterned lower hard mask layer 122. In some embodiments, he planarization process includes chemical mechanical planarization (CMP).

The method for manufacturing a semiconductor structure disclosed herein is a novel method, which includes performing a steam treatment after a dry etching process and/or a dry cleaning process. In this method, the inner surface of the substrate may be converted from a hydrophobic surface to a hydroxyl terminated surface, which may be ease to bond with the flowable dielectric material that is formed in subsequent operations. Therefore, the method of the present invention prevents the collapse of the highland portion of the substrate.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor structure, comprising:
    forming a lower hard mask layer on a substrate;
    forming a patterned middle hard mask layer on the lower hard mask layer, wherein the patterned middle hard mask layer has a plurality of openings exposing a portion of the lower hard mask layer;
    etching the exposed portion of the lower hard mask layer and a portion of the substrate under the exposed portion of the lower hard mask layer to form a patterned lower hard mask layer and a textured substrate, wherein the textured substrate has a plurality of trenches and a plurality of inner surfaces;
    performing a steam treatment on the textured substrate, wherein each of the inner surfaces has a hydroxyl terminated group after performing the steam treatment; and
    forming an isolation oxide layer to fill the trenches.

2. The method of claim 1, wherein the lower hard mask layer and the patterned middle hard mask layer are made of different material.

3. The method of claim 1, wherein the patterned middle hard mask layer has a staggered arrangement pattern.

4. The method of claim 1, wherein forming the patterned middle hard mask layer on the lower hard mask layer comprises a double patterning process.

5. The method of claim 1, wherein forming the patterned middle hard mask layer on the lower hard mask layer comprises:
    forming a layer of middle hard-mask material on the lower hard mask layer;
    patterning the layer of middle hard-mask material to form a line-patterned middle hard mask layer, wherein the line-patterned middle hard mask layer having a plurality of gaps exposing the lower hard mask layer;
    forming an upper hard mask layer covering the lower hard mask layer and the line-patterned middle hard mask layer;
    forming a patterned photoresist layer on the upper hard mask layer, wherein the patterned photoresist layer has a plurality of holes exposing a portion of the upper hard mask layer;
    etching the exposed portion of the upper hard mask layer and a portion of the line-patterned middle hard mask layer until the lower hard mask layer is exposed; and
    stripping the upper hard mask layer.

6. The method of claim 5, further comprising a BARC layer under the patterned photoresist layer.

7. The method of claim 1, wherein performing the steam process comprises treating the textured substrate with water vapor at 60-200° C. for a time period of 10-60 minutes.

8. The method of claim 1, wherein the isolation oxide layer comprises Polysilazane based spin-on dielectric.

9. The method of claim 1, further comprising:
    performing a dry cleaning process to the substrate before performing the steam treatment.

10. The method of claim 9, wherein the dry cleaning process comprises using a gas having a chemical formula of $C_nF_xH_y$, wherein n is an integer of 1 or 2, x is an integer ranged between 1 and 6, y is an integer ranged between 0 and 3.

11. The method of claim 1, wherein forming the isolation oxide layer comprises densifying a flowable dielectric material.

12. The method of claim 11, wherein densifying the flowable dielectric material comprises UV curing process or thermal curing process.

* * * * *